(12) United States Patent
Lo

(10) Patent No.: US 10,432,331 B1
(45) Date of Patent: Oct. 1, 2019

(54) WIRELESS SIGNAL LEVEL INDICATOR

(71) Applicant: JEBSEE ELECTRONICS CO., LTD., Tainan (TW)

(72) Inventor: Shan-Gow Lo, Tainan (TW)

(73) Assignee: JEBSEE ELECTRONICS CO., LTD., Tainan (TW)

( * ) Notice: Subject to any disclaimer, the term of this patent is extended or adjusted under 35 U.S.C. 154(b) by 0 days.

(21) Appl. No.: 16/233,073

(22) Filed: Dec. 26, 2018

(51) Int. Cl.
| | |
|---|---|
| H04B 1/16 | (2006.01) |
| H04B 17/00 | (2015.01) |
| H04B 17/318 | (2015.01) |
| H03H 7/12 | (2006.01) |
| H04B 17/23 | (2015.01) |

(52) U.S. Cl.
CPC ............ *H04B 17/318* (2015.01); *H03H 7/12* (2013.01); *H04B 17/23* (2015.01)

(58) Field of Classification Search
CPC ........ H04B 17/23; H04B 17/318; H04B 1/16; H04B 17/00
See application file for complete search history.

(56) References Cited

U.S. PATENT DOCUMENTS

| | | | | |
|---|---|---|---|---|
| 7,504,941 | B1 * | 3/2009 | Taskin | H04L 12/4625 370/401 |
| 9,485,041 | B1 * | 11/2016 | Huang | H04B 17/318 |
| 9,503,205 | B1 | 11/2016 | Huang | |
| 9,615,262 | B1 * | 4/2017 | Chaganti | H04W 24/08 |
| 2007/0287379 | A1 * | 12/2007 | Matsuura | H04B 1/0064 455/39 |
| 2010/0222018 | A1 * | 9/2010 | Rosenbusch | H04H 40/90 455/226.4 |
| 2011/0023074 | A1 * | 1/2011 | Nguyen | H04N 17/00 725/110 |
| 2011/0111715 | A1 * | 5/2011 | Buer | H01Q 1/1257 455/226.2 |
| 2018/0337450 | A1 * | 11/2018 | Tinaphong | H01Q 3/04 |

\* cited by examiner

*Primary Examiner* — Blane J Jackson
(74) *Attorney, Agent, or Firm* — J.C. Patents

(57) ABSTRACT

A wireless signal level indicator includes at least an antenna signal processing module, a signal level indicator (SLI), and a power supply module. This invention provides an innovative two-stage filtering technique; first, the low-pass filter (LPF) of the antenna signal processing module is used to filter out high-frequency signals that are not used by digital televisions; then a high-frequency pass filter (HPF) of the signal level indicator is used to filter out low-frequency signals that are not commonly used by digital televisions. In this way, the signal of the usual range of the general digital television can be selected, and this invention can produce a low signal loss and low noise factor wireless signal level indicator at low cost.

14 Claims, 5 Drawing Sheets

WIRELESS SIGNAL LEVEL INDICATOR

BACKGROUND OF THE INVENTION

1. Field of the Invention

This invention relates to a wireless signal level indicator, particularly to a signal level indicator (SLI) capable of displaying wireless digital television signal strength thereon.

2. Description of the Prior Art

As the quality of wireless digital TV is getting better and better, any users can watch them at no charge, so the users are increasingly demanding the quality of digital antennas to receive signals. However, the quality of the received signal is not completely determined by the performance of the digital antenna, in fact, the placement position of digital antenna is a more important key point. Therefore, in order to obtain the best placement position of the digital antenna, there are two methods that the user can use, which are described as follows:

First, find out the position of the antenna with the strongest TV signal through the quality of the picture presented on the TV screen, this method must constantly adjust the antenna position through the user, and then find the position of the strongest TV signal from the TV picture quality. However, the disadvantage of this method is that at least two people must work together to complete the antenna installation, sometimes the position of the antenna is far from the position where the TV is placed, so it is very inconvenient to use and it is very difficult for only one user to complete the antenna installation independently. Moreover, not the signal strength of one or more TV channels is good, indicating that the signal strength of all TV channels are also good, so it is very difficult for an inexperienced user to find the best signal position.

Second, connect a signal measuring device to the antenna, the user can find the best antenna placement position according to the signal strength displayed on the signal measuring device. Although connect a signal measuring device to the antenna allows the user to directly judge whether the signal strength of the antenna placement position is optimal, and the user does not need to judge the quality of the television signal through TV picture. However, in fact, there are a lot of wireless signals in the environment, and the intensity of each signal is different, if the signal detection range of the signal measuring device is inaccurate, the signal measuring device can be easily misled by a strong TV signal or non-TV signal. This is the problem with the current signal measuring devices on the market.

In addition, the prior art of the signal measuring device such as U.S. Pat. Nos. 9,485,041 and 9,503,205, which uses a Band Pass Filter (BPF) to filter the antenna signals and output signals of a selected frequency range (that is, the frequency range of a general digital television), and analyze the signal strength of the selected frequency range. Although the BPF can directly filter out signals of a selected frequency range, however, the disadvantage is that the BPF will cause a high signal loss for the filtered signal, a causes the noise factor of the output filtered signal to become larger, thereby affecting the quality of the output television signal, even if an amplifier with a low noise factor is used, this disadvantage still cannot be solved. Moreover, the cost of the BPF is very high and not economical, and the signal measuring device measures signals in the entire selected frequency range, so the measurement result also will be easily misled by a strong TV signal.

Therefore, the inventor of this invention, having much experience in designing and manufacturing related electronic equipment such as automotive electronics and wireless signal receiving systems, understands and researches the problem of the foregoing signal measuring device and hence devised this invention.

SUMMARY OF THE INVENTION

The objective of this invention is to use a low-frequency pass filter (LPF) to filter out high-frequency signals that are not used by digital televisions to avoid high-intensity non-television signals causing high load and crash problems of television or signal amplifier, then to amplify the first filtered signal by a low noise factor amplifier so that the amplified signal can be synchronously output (for TV use) and measured (by signal level indicator). Said signal level indicator is provided with a high-frequency pass filter (HPF) to filter out low-frequency signals that are not commonly used in digital televisions, then converting the power of the second filtered signal into a DC voltage signal by a detector. Finally, an intensity signal of the operation result is output to the display member by an operation unit, and the signal level information is correspondingly displayed on the display member. Since said LPF and the HPF have the characteristics of low signal loss and low cost, so the present invention can produce a highly accurate signal level indicator with the lowest cost.

The wireless signal level indicator in the present invention includes at least an antenna signal processing module, a signal level indicator, and a power supply module. Said antenna signal processing module is provided with an antenna signal input port, a low-frequency pass filter and an amplifier; said low-frequency pass filter is used to filter out high-frequency signals that are not used by digital televisions, to obtain a first filtered signal; said amplifier is connected to the low-frequency pass filter, the amplifier amplifies the first filtered signal according to a preset gain value so as to output an amplified signal to the signal output port and the signal level indicator. Said signal level indicator is provided with a high-frequency pass filter, a detector, an operation unit and a display member; said high-frequency pass filter receives the amplified signal of said amplifier and filters out low-frequency signals that are not commonly used by digital televisions, so that the signal of the usual range of the general digital television can be selected, and outputting the second filtered signal to the detector; said detector converts the power of the second filtered signal of the high-frequency pass filter into a DC voltage signal, and outputs the DC voltage signal to the operation unit; said operation unit operates the DC voltage signal of the detector and outputs an intensity signal of the operation result to the display member; said display member is configured to display a corresponding signal strength indication according to the received strength signal of the operation unit.

The dynamically optimized ballast of present invention, among which said high-frequency pass filter can be replaced with a band pass filter or a switchable multi-band pass filter, so as to obtain an antenna mounting orientation with better and more accurate overall signal quality. Said switchable multi-band pass filter may be provided with a plurality of band pass filters and a switch to perform multiple bands switching.

The dynamically optimized ballast of present invention, among which said low-frequency pass filter filters out high-frequency signals above 790 MHz, and said high-pass filter filters out low-frequency signals below 470 MHz.

The dynamically optimized ballast of present invention, among which said antenna signal processing module and signal level indicator may be mounted in a antenna to form an integrated structure, so that there is no need to arranged a cable between the antenna and the antenna signal processing module to eliminate the antenna signal loss and noise factor problem caused by the cable in the process of transmitting the antenna signal.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
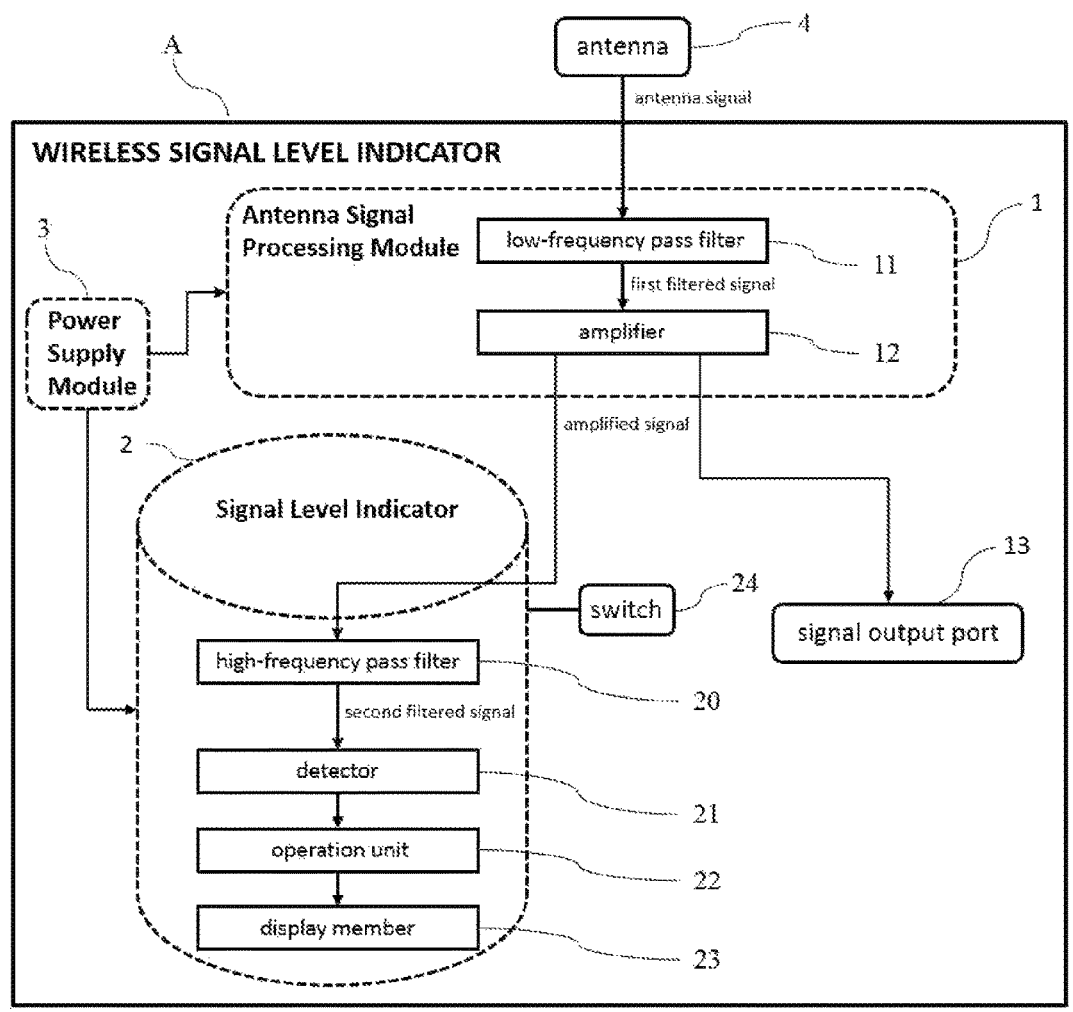
FIG. 1 is a block diagram illustrating the first embodiment in the present invention.

A preferred embodiment of a wireless signal level indicator in the present invention, as shown in FIG. 1-5, includes at least an antenna signal processing module 1, a signal level indicator (SLI) 2, and a power supply module 3 as main components combined together.

Said antenna signal processing module 1 is provided with an antenna signal input port 10 for connecting the antenna signal of an antenna 4. Said antenna signal processing module 1 is provided with a low-frequency pass filter (LPF) 11 and an amplifier 12, the LPF 11 is used to filter out high-frequency signals that are not used by digital televisions (about 790 MHz or more, depending on each region), to obtain a first filtered signal and avoid high-intensity non-television signals causing high load and crash problems of television or signal amplifier.

Said amplifier 12 is connected to the LPF 11, the amplifier 12 amplifies the first filtered signal according to a preset gain value so as to output an amplified signal to the signal output port 13 and the SLI 2, and the amplified signal of the signal output port 13 can be connected to the digital television. Said amplifier 12 may be a signal amplifier having a low noise factor and a high gain value.

Said SLI 2 is provided with a high-frequency pass filter (HPF) 20, a detector 21, an operation unit 22 and a display member 23.

Said HPF 20 receives the amplified signal of said amplifier 12 and filters out low-frequency signals that are not commonly used by digital televisions (about 470 MHz or less, depending on each region), in this way, the signal of the usual range of the general digital television (about 470 MHz to 790 MHz, depending on each region) can be selected, and outputting the second filtered signal to the detector 21.

Said detector 21 converts the power of the second filtered signal of the HPF 20 into a DC voltage signal, and outputs the DC voltage signal to the operation unit 22. Said operation unit 22 operates the DC voltage signal of the detector 21 and outputs an intensity signal of the operation result to the display member 23. Said display member 23 is configured to display a corresponding signal strength indication according to the received strength signal of the operation unit 22, the display member 23 may be a plurality of signal lights or a display screen, depending on the requirements. In this way, the user can judge the intensity of the signal through the number of signal lights, the color of signal lights, or directly judge the intensity of the signal through the information displayed on the display screen.

Said SLI 2 may be provided with a switch 24 for allowing the user to selectively turn off or turn on the SLI 2, so that the SLI 2 can be turned off when there is no need to measure signal strength, to save unnecessary power consumption.

Figure 2:
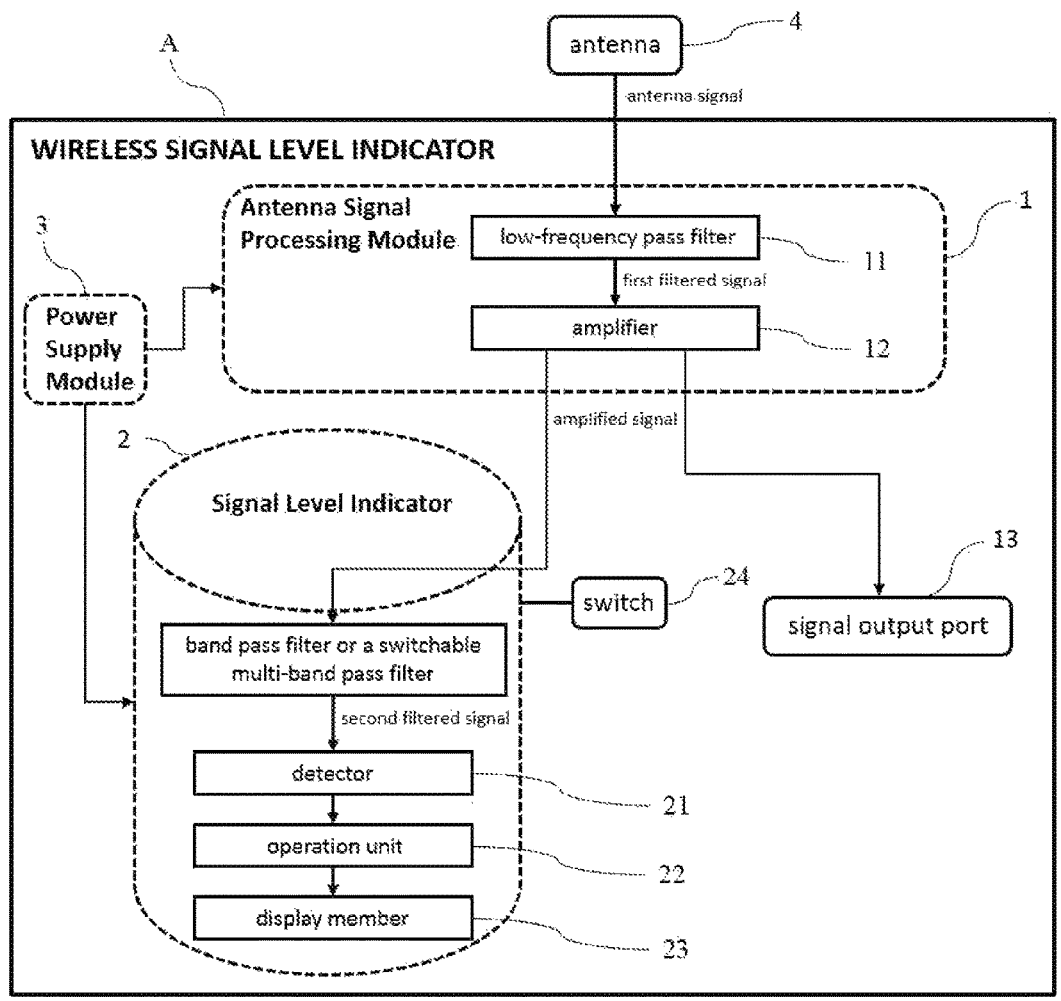
FIG. 2 is a block diagram illustrating the second embodiment in the present invention.

As shown in FIG. 2, in order to prevent the signal level measurement result from being misled by a strong signal, if the signal strength in a band is known to be weak in a region, said HPF 20 can be replaced with a band pass filter (BPF) or a switchable multi-band pass filter. In this way, the user can perform signal strength measurement specifically for the frequency band with weak signal strength, so as to obtain an antenna mounting orientation with better and more accurate overall signal quality. Said switchable multi-band pass filter may be provided with a plurality of band pass filters and a switch to perform multiple bands switching.

Said power supply module 3 is connected to the antenna signal processing module 1 and the signal level indicator 2 to supply power thereof. The power supply module 3 may be a USB power supply system.

Figure 3:
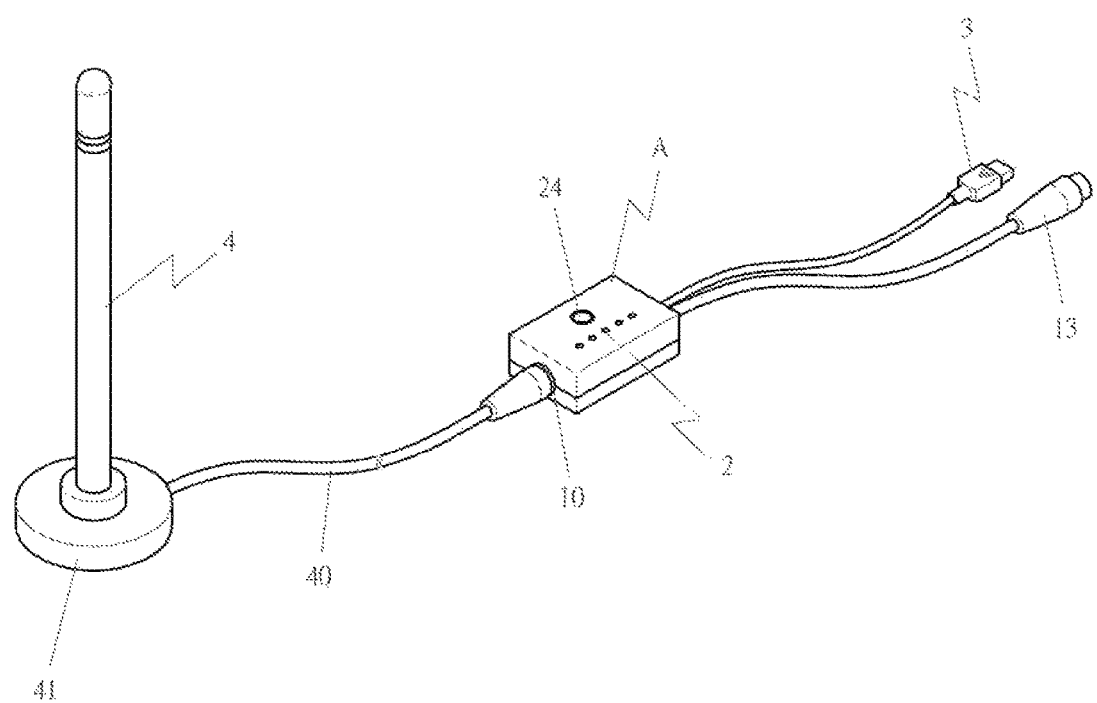
FIG. 3 is a schematic diagram illustrating the SLI of the present invention used in conjunction with a separate antenna.
Figure 4:
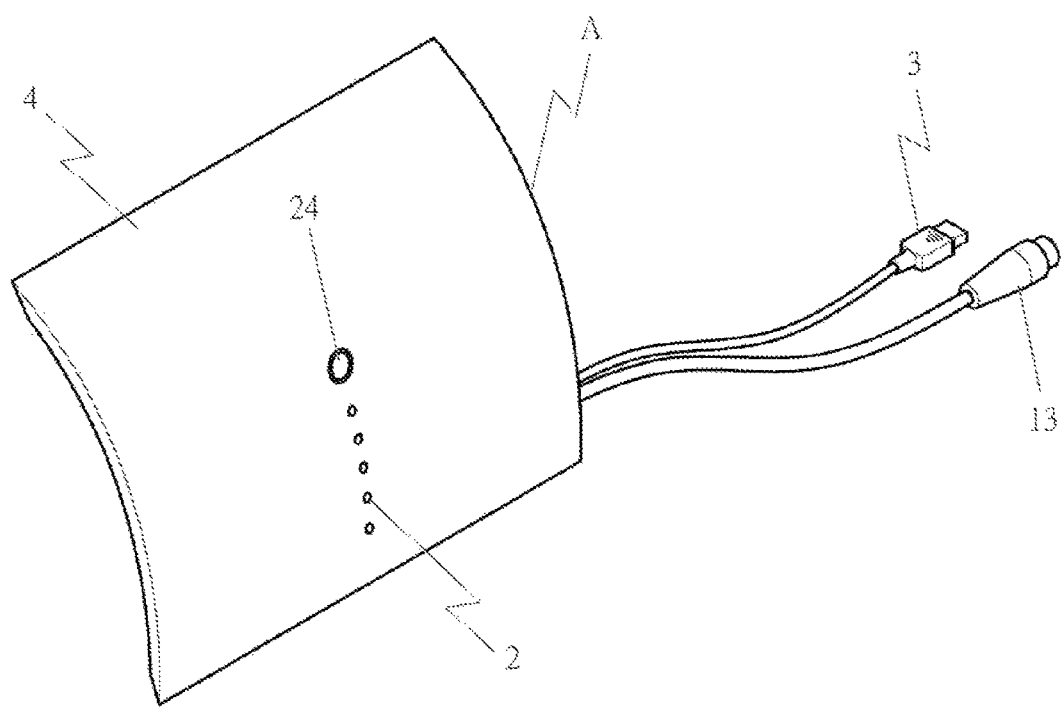
FIG. 4 is a schematic diagram illustrating the SLI of the present invention integrated with an antenna.
Figure 5:
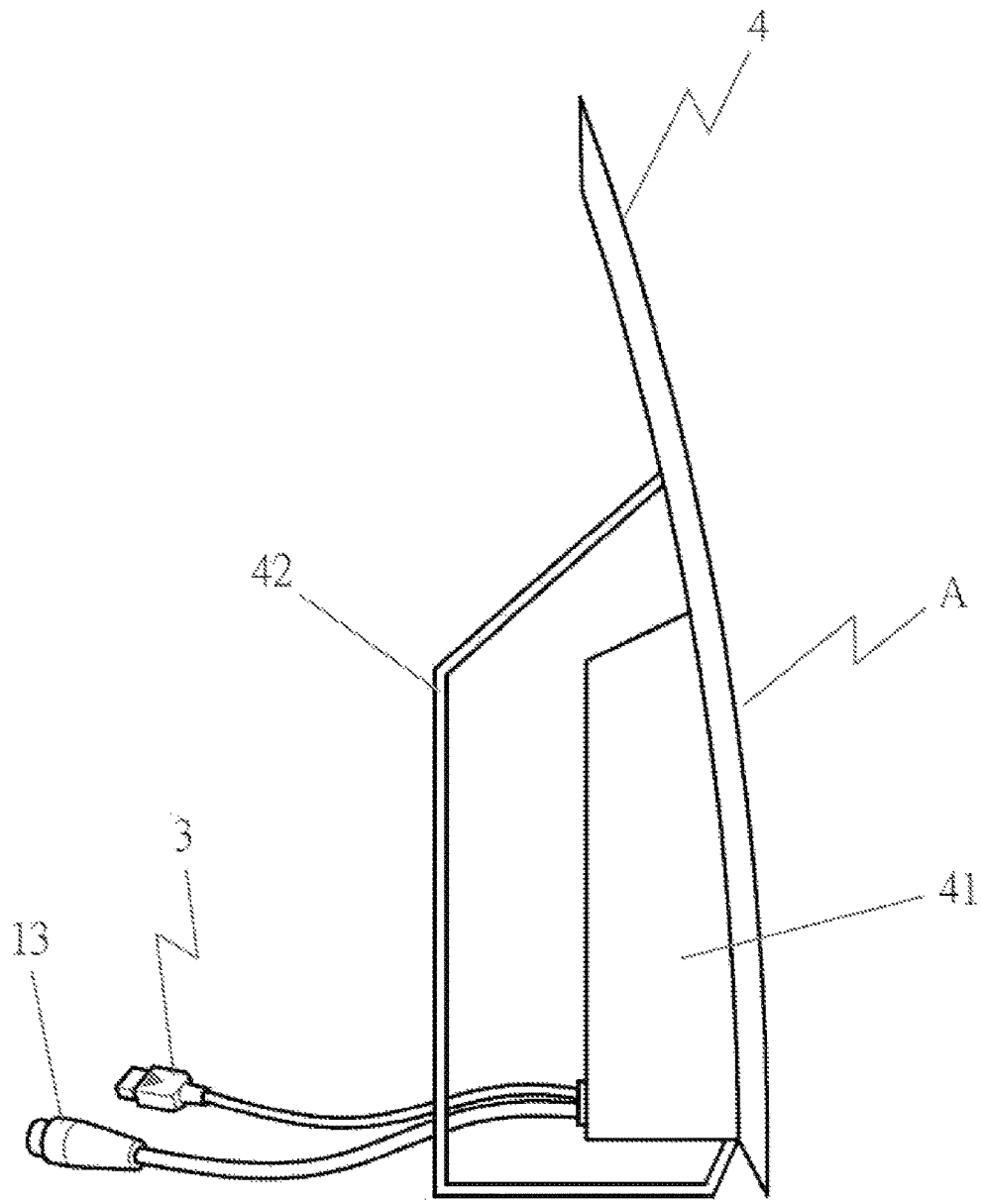
FIG. 5 is a side view of FIG. 4.

As shown in FIG. 3, said antenna 4 may be a generally independent antenna structure (for example, a rod-shaped omnidirectional antenna or a plate-shaped directional antenna), the antenna signal is transmitted to the antenna signal processing module 1 by a cable 40. As shown in FIG. 4, the antenna 4 may be provided with a base 41, said antenna signal processing module 1 and signal level indicator 2 are mounted in the base 41. In this way, the antenna signal processing module 1, the signal level indicator 2 and the antenna 4 can form an integrated structure, so that there is no need to arranged a cable 40 between the antenna 4 and the antenna signal processing module 1 to eliminate the antenna signal loss and noise factor problem caused by the cable 40 in the process of transmitting the antenna signal. Said antenna 4 may be provided with a wall bracket 42 to make the antenna 4 easy to mount on the wall.

In summary, the present invention can produce a low signal loss and low noise factor wireless signal level indicator through an innovative two-stage filtering technology, and said signal level indicator 2 can also replace the HPF 20 with a band pass filter or a switchable multi-band pass filter according to different requirements, to obtain an antenna mounting orientation with better and more accurate overall signal quality, and to prevent the signal level measurement result from being misled by a strong signal. Evidently this invention has tangible benefits and tallies with progressiveness and novelty demanded by patent laws.

While the preferred embodiments of this invention have been described above, it will be recognized and understood that various modifications may be made therein and appended claims are intended to cover all such modifications that may fall within the spirit and scope of the invention.

What is claimed is:

1. A wireless signal level indicator at least comprising:
an antenna signal processing module, is provided with an antenna signal input port, a low-frequency pass filter and an amplifier; said low-frequency pass filter is used to filter out high-frequency signals that are not used by digital televisions, to obtain a first filtered signal; said amplifier is connected to the low-frequency pass filter, the amplifier amplifies the first filtered signal according to a preset gain value so as to output an amplified signal to the signal output port and the signal level indicator;

a signal level indicator, is provided with a high-frequency pass filter, a detector, an operation unit and a display member; said high-frequency pass filter receives the amplified signal of said amplifier and filters out low-frequency signals that are not commonly used by digital televisions, so that the signal of the usual range of the general digital television can be selected, and outputting the second filtered signal to the detector; said detector converts the power of the second filtered signal of the high-frequency pass filter into a DC voltage signal, and outputs the DC voltage signal to the operation unit; said operation unit operates the DC voltage signal of the detector and outputs an intensity signal of the operation result to the display member; said display member is configured to display a corresponding signal strength indication according to the received strength signal of the operation unit; and a power supply module, is connected to said antenna signal processing module and signal level indicator to supply power thereof.

2. The wireless signal level indicator according to claim 1, wherein said low-frequency pass filter filters out high-frequency signals above 790 MHz, and said high-pass filter filters out low-frequency signals below 470 MHz.

3. The wireless signal level indicator according to claim 1, wherein said signal level indicator is provided with a switch for allowing the user to selectively turn off or turn on the signal level indicator.

4. The wireless signal level indicator according to claim 1, wherein the wireless signal level indicator is provided with a antenna, and the antenna signal is transmitted to the antenna signal input port of the antenna signal processing module by a cable.

5. The wireless signal level indicator according to claim 1, wherein the wireless signal level indicator is provided with a antenna, the antenna is provided with a base, said antenna signal processing module and signal level indicator are mounted in the base; so that there is no need to arranged a cable between the antenna and the antenna signal input port of the antenna signal processing module to eliminate the antenna signal loss and noise factor problem caused by the cable in the process of transmitting the antenna signal.

6. A wireless signal level indicator at least comprising:

an antenna signal processing module, is provided with an antenna signal input port, a low-frequency pass filter and an amplifier; said low-frequency pass filter is used to filter out high-frequency signals that are not used by digital televisions, to obtain a first filtered signal; said amplifier is connected to the low-frequency pass filter, the amplifier amplifies the first filtered signal according to a preset gain value so as to output an amplified signal to the signal output port and the signal level indicator;

a signal level indicator, is provided with a band pass filter, so that the user can perform signal strength measurement specifically for the frequency band with weak signal strength, so as to obtain an antenna mounting orientation with better and more accurate overall signal quality; said signal level indicator is provided with a detector, an operation unit and a display member; said detector converts the power of the second filtered signal of the band pass filter into a DC voltage signal, and outputs the DC voltage signal to the operation unit; said operation unit operates the DC voltage signal of the detector and outputs an intensity signal of the operation result to the display member; said display member is configured to display a corresponding signal strength indication according to the received strength signal of the operation unit; and a power supply module, is connected to said antenna signal processing module and signal level indicator to supply power thereof.

7. The wireless signal level indicator according to claim 6, wherein said signal level indicator is provided with a switch for allowing the user to selectively turn off or turn on the signal level indicator.

8. The wireless signal level indicator according to claim 6, wherein the wireless signal level indicator is provided with a antenna, and the antenna signal is transmitted to the antenna signal input port of the antenna signal processing module by a cable.

9. The wireless signal level indicator according to claim 6, wherein the wireless signal level indicator is provided with a antenna, the antenna is provided with a base, said antenna signal processing module and signal level indicator are mounted in the base; so that there is no need to arranged a cable between the antenna and the antenna signal input port of the antenna signal processing module to eliminate the antenna signal loss and noise factor problem caused by the cable in the process of transmitting the antenna signal.

10. The wireless signal level indicator according to claim 6, wherein said band pass filter is a switchable multi-band pass filter.

11. The wireless signal level indicator according to claim 10, wherein said switchable multi-band pass filter is provided with a plurality of band pass filters and a switch to perform multiple bands switching.

12. The wireless signal level indicator according to claim 10, wherein said signal level indicator is provided with a switch for allowing the user to selectively turn off or turn on the signal level indicator.

13. The wireless signal level indicator according to claim 10, wherein the wireless signal level indicator is provided with a antenna, and the antenna signal is transmitted to the antenna signal input port of the antenna signal processing module by a cable.

14. The wireless signal level indicator according to claim 10, wherein the wireless signal level indicator is provided with a antenna, the antenna is provided with a base, said antenna signal processing module and signal level indicator are mounted in the base; so that there is no need to arranged a cable between the antenna and the antenna signal input port of the antenna signal processing module to eliminate the antenna signal loss and noise factor problem caused by the cable in the process of transmitting the antenna signal.

* * * * *